(12) United States Patent
Chang et al.

(10) Patent No.: US 10,103,697 B1
(45) Date of Patent: Oct. 16, 2018

(54) MULTIPHASE PULSE MODULATED TRANSMITTER (71) Applicant: NXP USA, INC., Austin, TX (US)

(72) Inventors: Chun-Wei Chang, Gilbert, AZ (US); Joseph Staudinger, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/790,712

(22) Filed: Oct. 23, 2017

(51) Int. Cl.
*H04K 1/02* (2006.01)
*H04L 25/03* (2006.01)
*H04L 25/49* (2006.01)
*H03F 3/24* (2006.01)
*H03F 3/19* (2006.01)
*H04B 1/04* (2006.01)

(52) U.S. Cl.
CPC .............. *H03F 3/245* (2013.01); *H03F 3/19* (2013.01); *H04B 1/0475* (2013.01); *H03F 2200/204* (2013.01); *H03F 2200/336* (2013.01); *H03F 2200/451* (2013.01); *H04B 2001/0408* (2013.01)

(58) Field of Classification Search
CPC .................................................... H04B 1/0475
See application file for complete search history.

(56) References Cited

U.S. PATENT DOCUMENTS

| 2012/0002755 | A1* | 1/2012 | Chen | ........................ | H03K 7/08 |
| | | | | | 375/302 |
| 2013/0063220 | A1* | 3/2013 | McCune, Jr. | ............ | H03C 3/02 |
| | | | | | 332/103 |

OTHER PUBLICATIONS

"Choosing the Best Power Divider for the Task of Signal Combining"; https://tcom.azureedge.net/~/media/files/tcom/knowledge-center/pdfs/microlab/microlab_white_paper_power_divider.pdf; downloaded Oct. 17, 2017.
"Microwaves101.com: Power Combining"; https://www.microwaves101.com/encyclopedias/power-combining; downloaded Sep. 18, 2017.
"Reactive RF Splitter"; RF Microwave Blog; http://www.e-meca.com/rf-microwave-blog/reactive-splitters; downloaded Sep. 18, 2017.
Chen, J-H., "A Polar-Transmitter Architecture Using Multiphase Pulsewidth Modulation", IEEE Transactions on Circuits and Systems—I: Regular Papers, vol. 58, No. 2, Feb. 2011.
Chen, Y-J., "Pulse-Modulated Polar Transmitters for Spectrum-Efficient Wireless Applications", IEEE 2014.
Chen, J-H., "Linearity Enhanced Wide-Bandwidth Pulse-Modulated Polar Transmitters for LTE Femtocell Applications", IEEE Transactions on Microwave Theory and Techniques, vol. 64, No. 1, Jan. 2016.
Hausmair, K., "Aliasing-Free Digital Pulse-Width Modulation for Burst-Mode RF Transmitters", IEEE Transactions on Circuits and Systems—I: Regular Papers, vol. 60, No. 2., Feb. 2013.
Liang, K-F., "A Wideband Pulse-Modulated Polar Transmitter Using Envelope Correction for LTE Applications", IEEE Transactions on Microwave Theory and Techniques, vol. 63, No. 8, Aug. 2015.

(Continued)

*Primary Examiner* — Shuwang Liu
*Assistant Examiner* — Gina McKie
(74) *Attorney, Agent, or Firm* — David G. Dolezal (57) ABSTRACT

A multiphase transmitter including a reactive combiner for combining amplified pulse modulated signals generated by multiple power amplifiers of the transmitter. In some embodiments, the reactive combiner is configured to inhibit odd order harmonics of the amplified pulse modulated signals in a power efficient manner.

20 Claims, 6 Drawing Sheets

(56) References Cited

OTHER PUBLICATIONS

Yang, H-S., "A Polar Transmitter Using Interleaving Pulse Modulation for Multimode Handsets", IEEE Transactions on Microwave Theory and Techniques, vol. 59, No. 8, Aug. 2011.
Yang, H-S., "A Dual-Phase Pulse-Modulated Polar Transmitter with High Efficiency and Linearity Using Power Recycling", IEEE 2015.

* cited by examiner

MULTIPHASE PULSE MODULATED TRANSMITTER

BACKGROUND OF THE INVENTION

Field of the Invention

This invention relates to a multiphase, pulse modulated transmitter with a reactive combiner.

Description of the Related Art

Multiphase pulse modulated transmitters are utilized in transmitting data in wireless systems. Some multiphase transmitters utilize a combiner for combining signals from multiple power amplifiers before transmitting.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Some multiphase pulse modulated transmitters utilize a combiner to combine the outputs of multiple power amplifiers before transmitting. Combiners such as a Wilkinson combiner or a hybrid combiner, combine the power of two or more input signals based on the amplitude and phase of those signals. When the input signals exhibit a difference in amplitude and/or a phase, the combining is lossy and some power is absorbed in a resistive element (isolation resistor). For example, if the signals have identical amplitude and phase, then ideally no power is dissipated in the isolation resistor. Where signals have identical amplitudes but exhibit a 180 degree phase difference, all power is dissipated in the isolation resistor. When utilized for combining multiple power amplifier outputs, such power dissipation may cause the transmitter to be power inefficient.

Embodiments disclosed herein utilize a reactive combiner for combining the output signals of multiple power amplifiers before transmitting. In some embodiments, the reactive combiner is configured to cancel out signals exhibiting a 180 degree phase difference by terminating them in a 0 ohm impedance, thereby not dissipating any power. In certain types of transmitters, such as Pulse Modulated Polar Transmitters (PMPT), power amplifiers produce signals at multiple frequencies which must be combined before transmitting. Some of the signals include harmonics which occur at frequencies which are integer multiples of the pulse width modulation frequency (fpwm), occurring both above and below the carrier frequency ($F_C$). In certain PMPT systems, signals are amplified by multiple amplifiers, where each signal contains fundamental, even order and odd order harmonics. Odd order harmonics contained in one signal may exhibit a 180 degree difference in phase from odd harmonics contained in the other signal. Fundamental and even order harmonics in one signal may exhibit a 0 degree phase difference from fundamental and even order harmonics in the other signal. Accordingly, with some embodiments, the odd order harmonics can be canceled out in a power efficient manner using a reactive combiner. Accordingly, fundamental and even order harmonics can be combined in a power efficient way using a reactive combiner to produce a larger signal.

One issue with reactive combiners is that they do not provide isolation between power amplifier outputs. Because of this characteristic, the impedance presented to one of the power amplifier outputs depends on the signal present on the other power amplifier output. Such a characteristic can prevent an amplifier from operating at its desired level under certain operating conditions. For example, in a two-phase digital pulse width modulated system such as a multiphase digital pulse width polar modulated transmitter, one power amplifier may be off for a specific interval of time and not generate an output signal while the other amplifier operates in gain compression (is characterized as being "on"). During other intervals in time, both amplifiers may be on. And still at other intervals in time, both amplifiers may be off, and not generate any power. The time intervals where this occurs is the reciprocal of the pulse width modulation frequency. In some embodiments, when both power amplifiers are on, the output of the combiner should be twice (or close to being twice) the power as when only one amplifier is on. For example, a two phase PMPT system may operate in one of four states at any given interval in time (power amp 1 ON-power amp 2 OFF, power amp 1 OFF-power amp 2 ON, power amp 1 ON-power amp 2 ON, and power amp 1 OFF-power amp 2 OFF). The non-isolating behavior of a reactive combiner may prevent each amplifier from operating as desired for all four states.

Accordingly, in order for the transmitter to operate properly in conditions where only one power amplifier is on or where all power amplifiers are on, a reactive combiner as disclosed herein includes branches having impedances that are sized to meet an impedance threshold when the power amplifier coupled to the branch is off and a power amplifier coupled to another branch is on such that the power level of the output of the combiner operably scales with the number of power amplifiers that are on.

Figure 1:
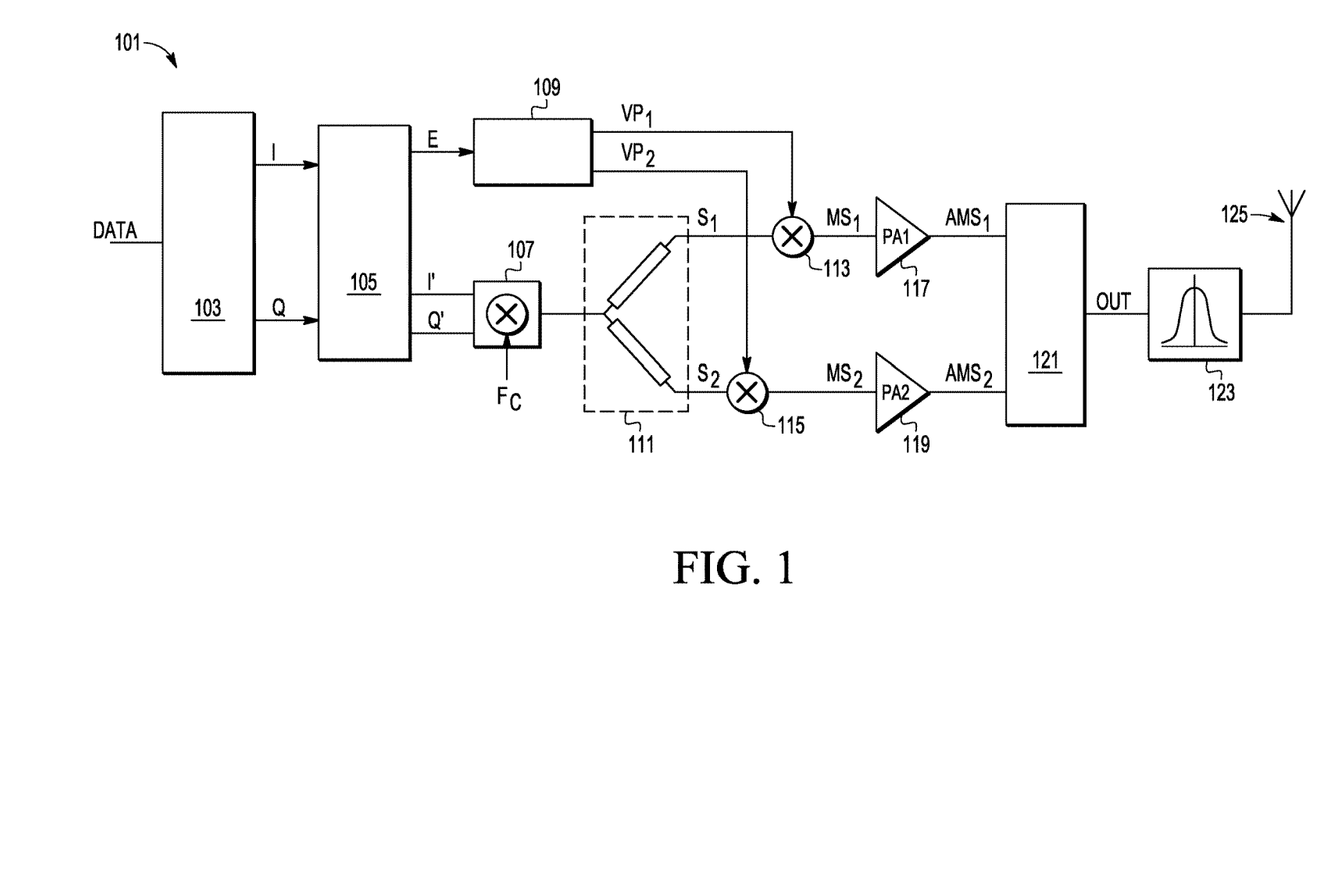
FIG. 1 is a multiphase transmitter according to one embodiment of the present invention.

FIG. 1 is a circuit diagram of a wireless transmitter according to one embodiment of the present invention. In the embodiment shown, transmitter 101 is a two phase, Pulse Modulated Polar Transmitter for transmitting wireless signals on antennae 125 of the transmitter. In other embodiments, transmitter 101 may be another type of transmitter. In the embodiment shown, transmitter 101 includes a baseband processor 103 for converting data received from a source (e.g., an applications processor, a microphone) and converting the data into in-phase (I) and quadrature phase (Q) signals to be transmitted. Transmitter 101 includes a processor 105 (e.g., a DSP) for converting the in-phase and quadrature phase signals to into a magnitude signal (E), a normalized in-phase (I') signal, and a normalized quadrature (Q') signal. The normalized signals I' and Q' have been normalized into a unit magnitude such that they can be transformed into a constant envelope radio frequency (RF) signal by a vector modulator 107 at carrier frequency $F_C$. In one embodiment, the RF signal is a sinusoidal signal at a carrier frequency in the range of 2 GHz and encoded with data as per a cellular communications system protocol (e.g., wideband code division multiple access (WCDMA)), but may be another type of signal, be at other frequencies, and/or be encoded by other protocols in other embodiments.

The magnitude signal (E) is utilized by pulse generator 109 to generate two aliasing-free digital pulse width modulated signals ($VP_1$ and $VP_2$). The output of vector modulator 107 is split by splitter 111 to create two constant envelope RF signals (S1 and S2). Each of the splitter output signals S1 and S2 are then modulated by modulators 113 and 115 with pulse signals VP1 and VP2, respectively, to produce pulse modulated signal MS1 and pulse modulated signal MS2. These signals include fundamental, odd order, and even order harmonic components.

The pulse modulated signals MS1 and MS2 are amplified by power amplifiers PA1 117 and PA2 119 to produce amplified modulated signals AMS1 and AMS2, respectively. In one embodiment, power amplifiers PA1 117 and PA2 119 are Class B or Class C amplifiers that are configured to consume no DC power when a zero volt signal is applied to its input. In some embodiments, when the inputs are at non zero values, the amplifiers are designed to operate in gain compression (characterized as being on). The amplified signals AMS1 and AMS2 are provided to reactive combiner 121 that combines the signals into an output signal (OUT). The OUT signal is filtered by bandpass filter 123 to remove the harmonics outside of a desired frequency band. The filtered signal is then transmitted on antennae 125. Other transmitters may have other configurations in other embodiments. In one embodiment, transmitter 101 is utilized in a cellular phone, but may be utilized in other types of wireless systems in other embodiments such a wireless router, a LAN network transmitter etc.

Figure 2:
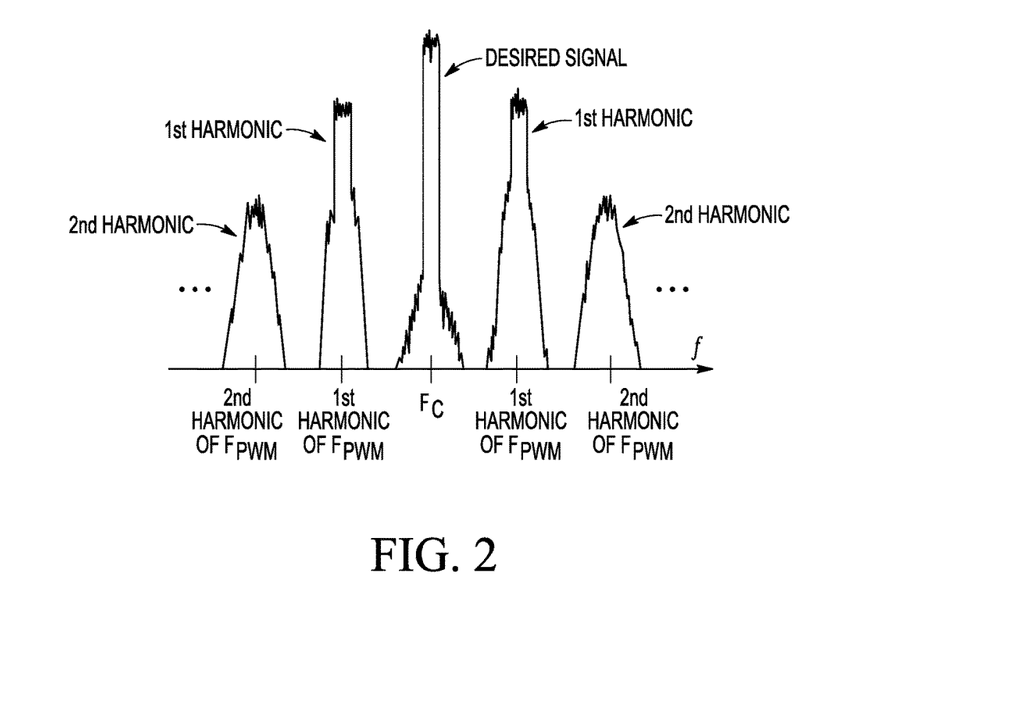
FIG. 2 is a graph showing a frequency response of signal at the input of a reactive combiner according to one embodiment of the present invention.

FIG. 2 shows a frequency response of an amplified pulse modulated signal (e.g., AMS1, AMS2) provided by a power amplifier prior to being combined by combiner 121. The desired signal is centered around the carrier frequency ($F_C$). The signal has odd order harmonics and even order harmonics of $F_{PWM}$ (the frequency of VP1 and VP2) with the $1^{st}$ order harmonics and the second order harmonics shown in FIG. 2. The odd order harmonics of AMS1 and AMS2 exhibit a 180 degree difference in phase with each other. Using a reactive combiner for combiner 121 provides for the cancellation of the odd order harmonics (e.g., the $1^{st}$ order harmonics shown in FIG. 2) from AMS1 and AMS2 without dissipating power. Similarly, third and higher order odd harmonics are cancelled without dissipating power in a reactive combiner. In the embodiment of FIG. 1, the even order harmonics ($2^{nd}$ order harmonic shown in FIG. 2) are not canceled out by combiner 121, but instead are filtered out by band pass filter 123. Canceling out the $1^{st}$ order harmonics in a power efficient manner with a reactive combiner may allow for the pass band of filter 123 to be wider in that it does not have to be sized to reject the 1st order harmonics. In one embodiment, the pulse signals VP1 and VP2 are at a frequency of 100 MHz, the harmonics are centered at frequencies of ±N*100 MHz from $F_C$ where N is an integer. However, the frequency of the pulse signals may be at other values in other embodiments. In one embodiment, the desired signal has a pulse frequency of 200 MHz. In one embodiment, the band pass frequency range of filter 123 is 20 MHz but may be of other ranges in other embodiments, such as 40 MHz or higher.

Figure 3:
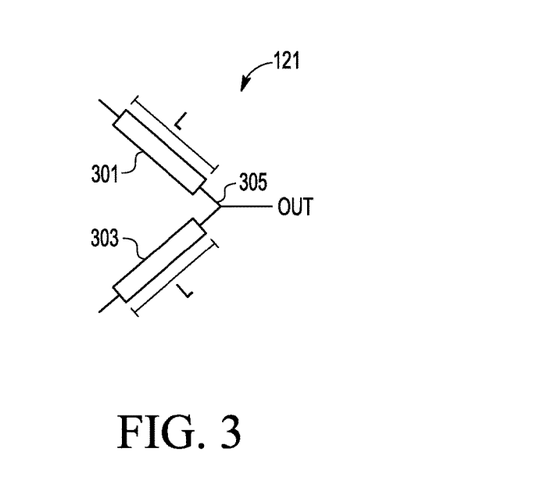
FIG. 3 is circuit diagram of a transmission line reactive combiner according to one embodiment of the present invention.

FIG. 3 is a circuit diagram of one embodiment of reactive combiner 121 according to one embodiment of the present invention. In the embodiment of FIG. 3, combiner 121 is a transmission line combiner that includes two reactive transmission line branches 301 and 303 that are configured to receive AMS1 and AMS2, respectively, and that are connected together at summing node 305. In one embodiment, branches 301 and 303 are implemented in a strip-line medium, but may be implemented in other transmission line mediums such as, e.g., a ladder line, coaxial cable, two wire, twisted pair, coplanar strip, coplanar wave guide, or microstrip medium. As will be discussed below with the description of FIGS. 6 and 7, combiner 121 is configured such that branches 301 and 303 have a characteristic impedance ($Z_O$), length (l), and phase constant (β) so that the power of the OUT signal reasonably scales with the number of power amplifiers (117 and 119) that are on at a given time. In some embodiments, the portion of combiner 121 between summing node 305 and its output may also be implemented with a transmission line.

Figure 4:
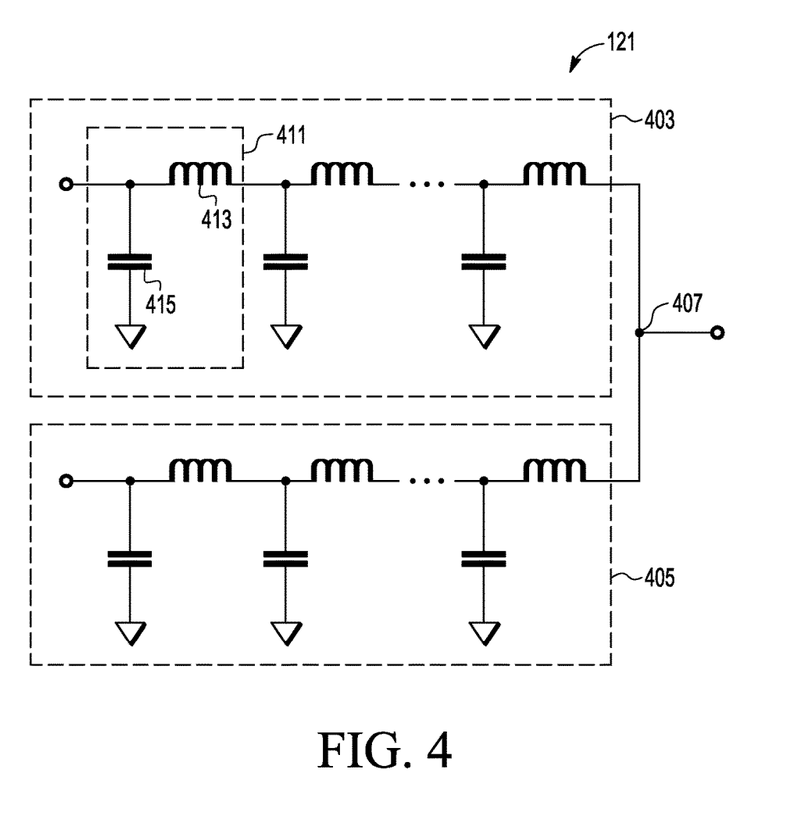
FIG. 4 is circuit diagram of a lumped element reactive combiner according to one embodiment of the present invention.

FIG. 4 is a circuit diagram of another embodiment of reactive combiner 121 according to another embodiment of the present invention. In FIG. 4, reactive combiner 121 is a lumped element reactive combiner that includes branches 403 and 405 configured to receive signals AMS1 and AMS2, respectively, and that are connected together at summing node 407. Each branch 403 and 405 of reactive combiner 121 includes one or more inductor-capacitor elements (411) that includes an inductor (413) and a capacitor (415). The size of the inductors and capacitors as well as the number of elements per branch determine the impedance of the branch. In the view of FIG. 4, each branch 403 and 405 is shown with three inductor-capacitor elements. For a lumped element combiner, the length l is defined by the number and value of LC elements (411) and the "phase constant (β)" is also defined by the values of the LC elements (411) as well.

Figure 5:
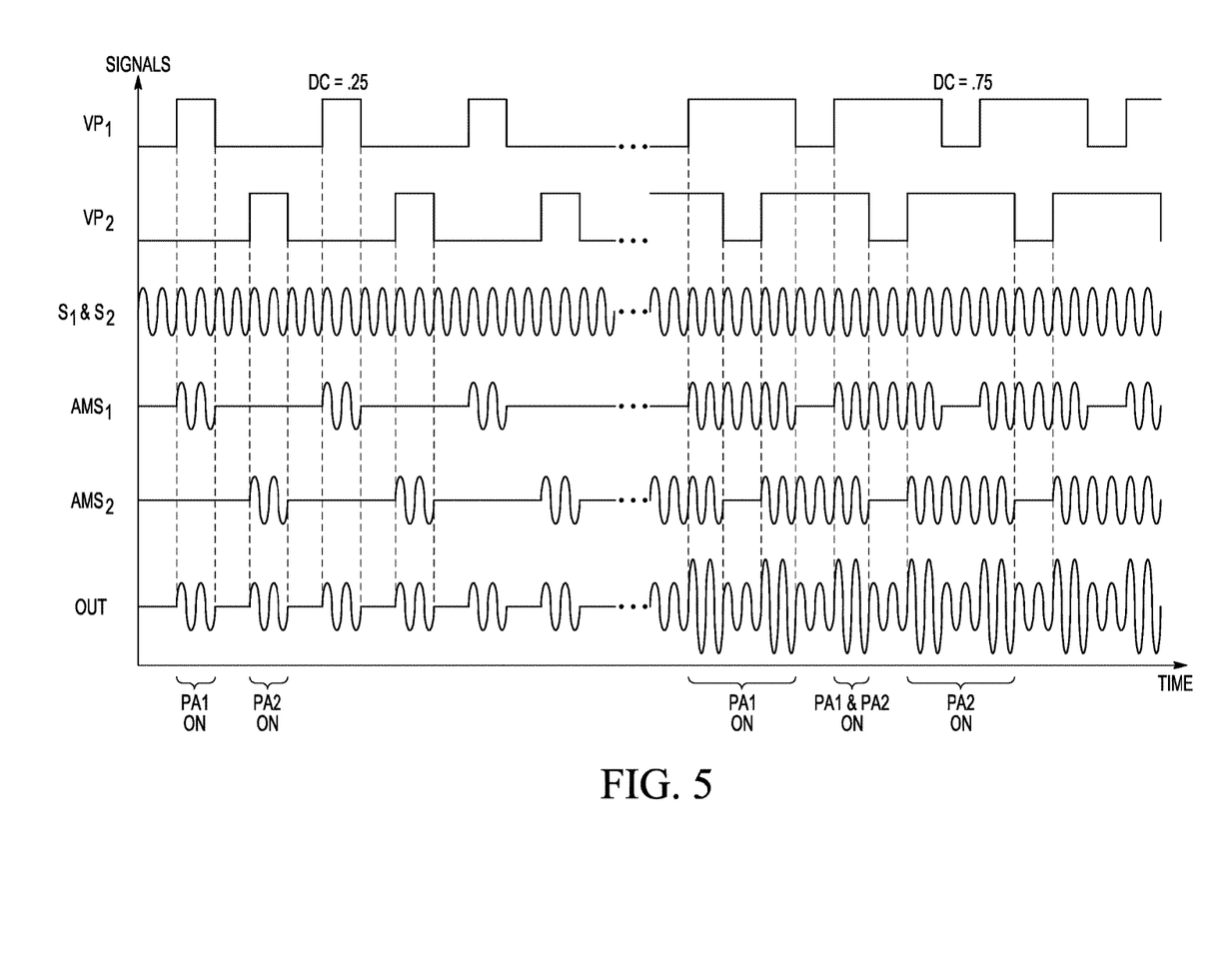
FIG. 5 is a timing diagram of signals of a transmitter circuit according to one embodiment of the present invention.

FIG. 5 is a timing diagram illustrating the signals of transmitter 101 during operation. FIG. 5 shows a first case where the duty cycle of pulse signals VP1 and VP2 is 0.25 and a second case where the duty cycle (DC) of pulse signals VP1 and VP2 is 0.75. In some embodiments of transmitter 101, the duty cycle is continuously adjusted based on the I and Q signals.

Constant envelope signals S1 and S2 are illustrated as one signal in FIG. 5. In one embodiment, the constant envelope signals S1 and S2 are constant envelope RF signals produced by vector modulator 107. In one embodiment, signals S1 and S2 include in-phase and quadrature data that are modulated at an RF frequency 2 GHz, but may be of another type of signal in other embodiments (e.g., 3.5 GHz).

Signals S1 and S2 are modulated with signals VP1 and VP2, respectively, to produce modulated signals MS1 and MS2, respectively (see FIG. 1). In one embodiment, signals VP1 and VP2 have 180 degree phase difference from each other. Signals MS1 and MS2 are then amplified by power amplifiers PA1 and PA2 to produce signals AMS1 and AMS2, respectively, whose outputs are shown in FIG. 5 as being pulsed constant amplitude phase modulated signals. Power amplifiers PA1 and PA2 amplify the magnitude of signals MS1 and MS2, respectively. When MS1 or MS2 is zero in amplitude, the power amplifier receiving the zero value MS1 or MS2 signal is characterized as being "off." When MS1 or MS2 is non-zero in amplitude, the corresponding power amplifier receiving the non-zero value MS1 or MS2 signal is characterized as being on.

The power amplifier output signals AMS1 and AMS2 are combined to produce a combined signal (OUT) by combiner 121. When the duty cycle is less than 0.5, the combined signal is a series of constant envelope signal pulses at a frequency that is twice that of the pulse signals VP1 and VP2. With a duty cycle of less than 0.5, the maximum output power of the combiner 121 output signal (OUT) at any one time is the output of one power amplifier. At a duty cycle of less than 0.5, both power amplifiers 117 and 119 are never on at the same time.

When the duty cycle is greater than 0.5, the pulses of the signals VP1 and VP2 overlap. When they overlap, the desired output power of combiner 121 may be approximately twice that of each power amplifier (117, 119) (depending upon the levels of the S1 and S2 signals at a particular time).

In the embodiment shown, to increase the power of the transmitted signal, the duty cycle is increased to increase the amount of time that each power amplifier is on. Even when the duty cycle rises above 0.5 and both power amplifiers are on at the same time, it is desirable that the output power of a power amplifier be at the same power level as when it is the only amplifier on. With such a feature, a power amplifier can be sized where its output operates at an efficient power range (e.g., in compression) for the constant envelope signal, so that the power of the combiner output signal can be increased without having the output of either power amplifier exceed that efficient power range.

Figure 6:
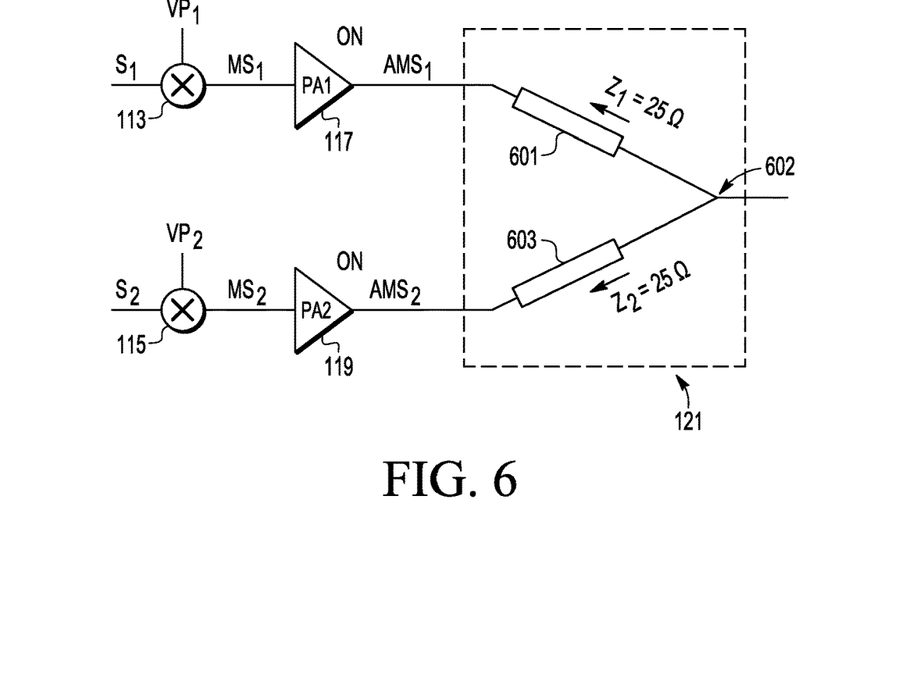
FIGS. 6 and 7 are annotated circuit diagrams of a portion of a transmitter circuit showing two different conditions of operation according to one embodiment of the present invention.
Figure 7:
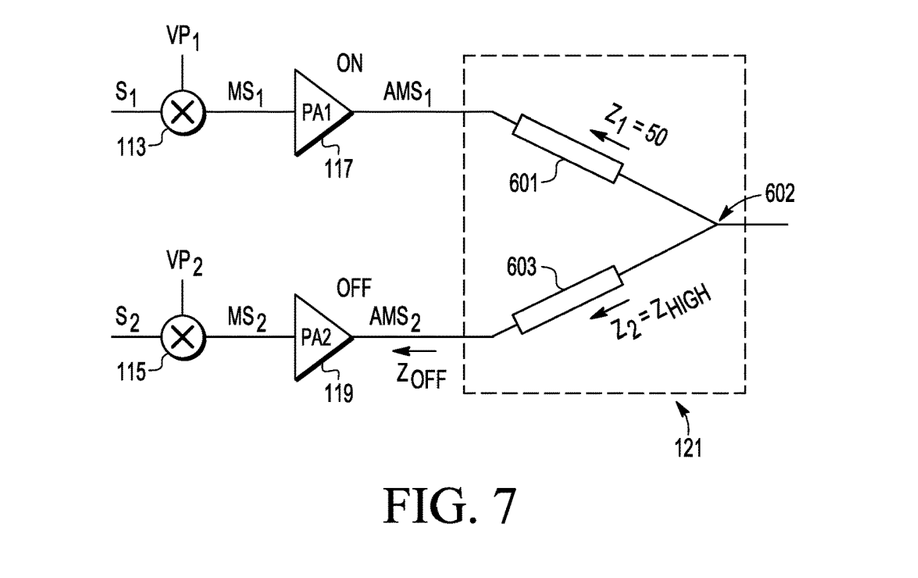

FIGS. 6 and 7 are annotated circuit diagrams of a portion of transmitter 101 illustrating concepts in configuring combiner 121 to enable the power of combiner 121 to scale with the number of power amplifiers that are "on" at a point in time. FIG. 6 shows a condition when both power amplifiers 117 and 119 are on, which may occur when both the VP1 and VP2 signals are high and the signals S1 and S2 are both at voltages that cause amplifiers 117 and 119 to operate in compression. As shown in FIG. 6, when both power amplifiers are on, the impedance looking into each branch 601 and 603 of combiner 121 from summing node 602 is approximate the same (e.g., 25 ohms) for the characteristic impedance, length, and phase constant of each branch.

FIG. 7 shows a case where power amplifier 117 is on and power amplifier 119 is off (e.g., when signal VP2 is between pulses). Because combiner 121 is a reactive combiner and does not exhibit isolation between the branches, the power level of the output of amplifier 119 affects the impedance presented to the output of power amplifier 117. Thus, the change in power level of the amplifier 119 from being on (as in FIG. 6) to being off (as in FIG. 7) can change the impedance seen by amplifier 117 and therefore undesirably (in some cases) change the power level of amplifier 117. Because of this change in impedance due to the number of amplifiers that are on at a given time, the output of some reactive combiners may not necessarily scale within a desired range with the number of amplimers that are on.

Accordingly, in some embodiments, the impedances of the branches 601 and 603 of combiner 121 are designed such that when one of the amplifiers is off (e.g., amplifier 119) and the other is on, the impedance seen by the "on" power amplifier is large enough such that the output of combiner 121 is at a first power level when only one amplifier is on, and the output of the combiner 121 is at a second power level that is 1.6-2.4 times the first power level when both power amplifiers are on. In other embodiments, the second power level may be in the range of 1.9-2.1 times the first power level, depending upon the implementation.

In one embodiment, in designing the branches of a reactive combiner, each branch is configured to have a characteristic impedance $Z_0$, length l, and phase constant $\beta$ defined by equation 1 below:

$$Z_{high} = \frac{V(l)}{I(l)} = \frac{1+|\Gamma|e^{-2j\beta l}}{1-|\Gamma|e^{-2j\beta l}} Z_0$$

$$\Gamma = \frac{Z_{off} - Z_0}{Z_{off} + Z_0}$$

$Z_{HIGH}$ is an impedance at the summing node of a combiner looking back into the branch when its respective power amplifier is off while only one other power amplifier coupled to an input of a branch of the combiner is on. $Z_{OFF}$ is the impedance of the input of the branch looking back into its respective power amplifier when its respective power amplifier is off while only one other power amplifier is on. FIG. 7 shows $Z_{HIGH}$ and $Z_{OFF}$ for branch 603 of combiner 121 when PA1 117 is on and PA2 119 is off.

$Z_{HIGH}$ is a target impedance value set such that the impedance presented by the "off" amplifier does not affect the impedance level at the summing node (602). In some embodiments, the set value for $Z_{HIGH}$ depends on the power level of the transmitter and the device technology (e.g., silicon, LDMOS, GaAs, GaN) of the devices of the power amplifiers. In some embodiments, $Z_{HIGH}$ is at least 100 ohms. In other embodiments, $Z_{HIGH}$ is greater than 400 ohms (e.g., 400-500 ohms) where the power of the transmitter is 7 watts or less. In some embodiments, the higher the impedance value for $Z_{HIGH}$, the better the scalability of the power of the combiner output with respect to the number of amplifiers that are on. In some embodiments, power amplifiers that are made with silicon transistors would require a higher $Z_{HIGH}$ value to meet a desired scalability requirements than amplifiers made with gallium nitride (GaN) transistors. In other embodiments, for higher power transmitters (e.g., 100 watts or greater), a $Z_{HIGH}$ of 100 ohms may be sufficient.

As shown in the condition of FIG. 7, the impedance looking into branch 601 from summing node 602 in 50 ohms. As shown in FIG. 6, when both amplifiers 117 and 119 are on, the impedance looking into each branch from node 602 is 25 ohms.

In one embodiment, a transmitter includes a two branch combiner that is configured to have a $Z_{HIGH}$ of at least 300 ohms. Each branch has a characteristic impedance of 50 ohms, a length l of 0.375 of the wavelength of the carrier frequency, and a phase constant $\beta$ of 90 degrees. The two branch combiner is implemented using microstrip transmission lines. The transmitter is a 5 watt (W) average power transmitter with two class C power amplifiers implemented with laterally diffused metal oxide semiconductor (LDMOS) transistors. Each amplifier is biased at a quiescent current of 1.1 mA under a 28V power supply voltage and is capable of providing saturated power of 40 dBm (decibels referenced to milliwatts). The RF frequency of the constant envelope sinusoidal signals (S1 and S2) is 2.14 GHz and the frequency of the pulse signals (VP1, VP2) is 100 MHz The 1$^{st}$ order harmonics are at 100 MHz offset from 2.14 GHz. With such a configuration, the combiner output provides a power level when both power amplifiers are on of 43 dBm (peak power) and approximately 40 dBm when only one amplifier is on.

Figure 8:
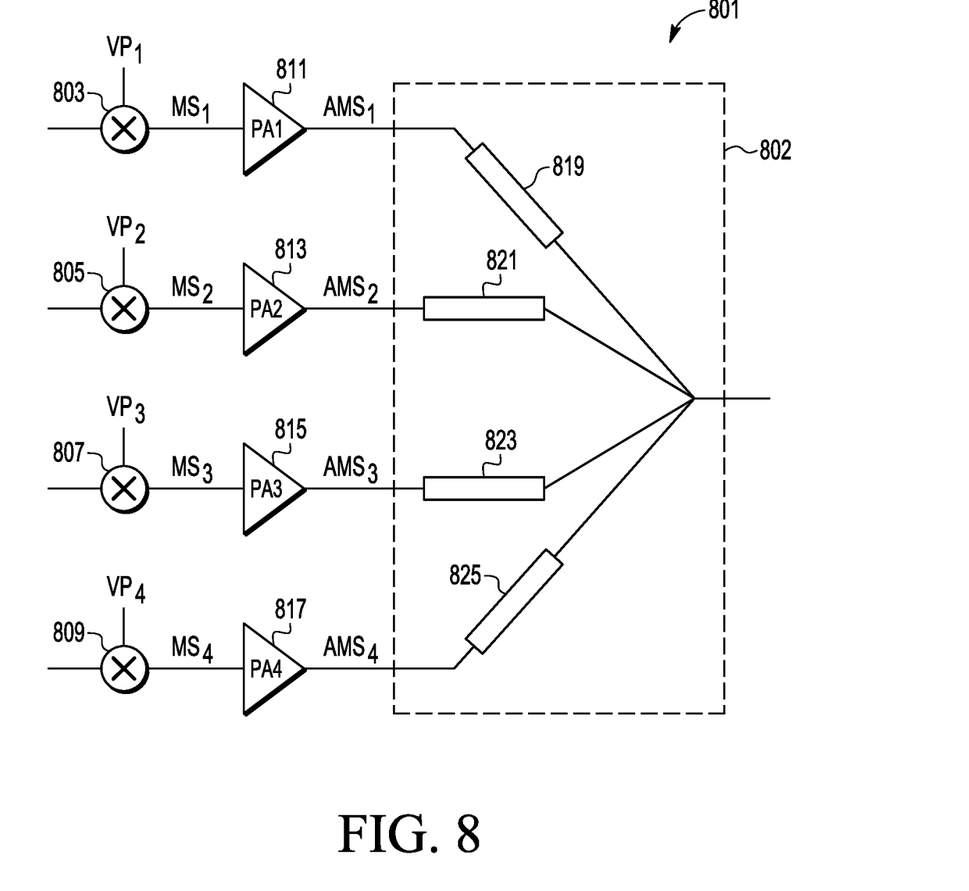
FIG. 8 is a circuit diagram of a transmitter circuit according to another embodiment of the present invention.

FIG. 8 shows a circuit diagram of a four branch reactive combiner 802 in a transmitter 801. Each branch 819, 821, 823, and 825 is coupled to the output of a respective power amplifier (811, 813, 815, and 817). The power amplifiers each receive pulse modulated signals MS1, MS2, MS3, and MS4 that are modulated by modulators 803, 805, 807, and 809 with pulse signals VP1, VP2, VP3, and VP4, respectively. In one embodiment, the pulse signals are 90 degrees out of phase from each other. In one embodiment, the characteristic impendences, length, and phase constants of the branches are selected as per equation 1 above to provide a $Z_{HIGH}$ value that is above a set value (e.g., 100 ohms). With such selected impedances, the circuit of FIG. 8 provides reasonable scalability of the output power of combiner 802 with respect to the number of power amplifiers that are on at any one time. In one embodiment, the power output of combiner 802 is N*(P±20%), where N is the number of amplifiers that are on and P is the output power when only one amplifier is on. However, the desired scalability factor may depend on intended circuit use. In other embodiments, a combiner may have a different number of branches. With some embodiments, the voltage pulse signals are out of phase with each other by 360 degrees/N where N is the number of branches of a combiner.

In one embodiment, the branches are designed to have the same impedances and the power amplifiers are designed to have the same power output levels. However, in other embodiments, the branches of a reactive combiner may be designed with different impedances with respect to each other and/or the power output level of each power amplifier may be different. Also in some embodiments, the frequency of the pulse width signals may be different from each other as well.

In one embodiment, a multiphase transmitter circuit includes a pulse generator including a first output to generate a first pulse signal and a second output to generate a second pulse signal. The transmitter circuit includes a first modulator including a first input to receive a first signal and a second input to receive the first pulse signal. The first modulator modulating the first signal and the first pulse signal to produce a first pulse modulated signal at an output of the first modulator. The transmitter circuit includes a second modulator including a first input to receive a second signal and a second input to receive the second pulse signal. The second modulator modulating the second signal and the second pulse signal to produce a second pulse modulated signal at an output of the second modulator. The transmitter circuit including a group of power amplifiers. The group of power amplifiers including a first power amplifier including an input to receive the first pulse modulated signal and an output to produce a first amplified pulse modulated signal and including a second power amplifier including an input to receive the second pulse modulated signal and an output to produce a second amplified pulse modulated signal. The transmitter circuit includes a reactive combiner including a plurality of branches. Each branch of the plurality of branches coupled to receive an amplified pulse modulated signal produced by a respective power amplifier of the group of power amplifiers. The plurality of branches includes a first branch to receive the first amplified pulse modulated signal and a second branch to receive the second amplified pulse modulated signal. The reactive combiner combines the amplified pulse modulated signals received at its branches to produce an output signal at an output of the reactive combiner. The branches of the plurality of branches are each configured to have an impedance such that the output signal is at a first power level when only one power amplifier of the group of power amplifiers is on and is at a second power level when only two power amplifiers of the group of power amplifiers is on. The second power level is in a range of 1.6-2.4 times the first power level.

In another embodiment, a method for operating a transmitter includes modulating a first signal with a first pulse signal to produce a first pulse modulated signa, modulating a second signal with a second pulse signal to produce a second pulse modulated signal, amplifying the first pulse modulated signal by a first power amplifier of a group of power amplifiers to produce a first amplified pulse modulated signal, amplifying the second pulse modulated signal by a second power amplifier of the group of power amplifiers to produce a second amplified pulse modulated signal, providing the first pulse modulated signal to a first branch of a plurality of branches of a reactive combiner, providing the second pulse modulated signal to a second branch of the plurality of branches of the reactive combiner, and producing an output signal by combining with the reactive combiner, amplified pulse modulated signals provided to each branch of the plurality of branches and produced by a respective power amplifier of the group. The combining including combining the first pulse modulated signal and the second pulse modulated signal. A power level of the output signal is at a first power level when only one power amplifier of the group is on and is at a second power level when only two power amplifiers of the group are on. The second power level is in a range of 1.6-2.4 times the first power level.

Another embodiment includes a method for operating a transmitter. The method includes modulating a first signal with a first pulse signal to produce a first pulse modulated signal. The first signal is a constant envelope RF signal. The method includes modulating a second signal with a second pulse signal to produce a second pulse modulated signal. The second signal being a constant envelop RF signal. The second pulse signal being offset by a phase difference from the first pulse signal. The method includes amplifying the first pulse modulated signal by a first power amplifier of a group of power amplifiers to produce a first amplified pulse modulated signal, amplifying the second pulse modulated signal by a second power amplifier of the group of power amplifiers to produce a second amplified pulse modulated signal, providing the first amplified pulse modulated signal to a first branch of a plurality of branches of a reactive combiner, providing the second amplified pulse modulated signal to a second branch of the plurality of branches of the reactive combiner, and producing an output signal by combining with the reactive combiner, amplified pulse modulated signals provided to each branch of the plurality of branches and produced by a respective power amplifier of the group of power amplifiers. The combining includes combining the first pulse modulated signal and the second pulse modulated signal. A power level of the output signal is at a first power level when only one power amplifier of the group is on and is at a second power level when only two power amplifiers of the group are on. The producing the output signal by the reactive combiner includes inhibiting from the output signal odd order harmonics of a frequency of the first pulse signal by the reactive combiner.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A multiphase transmitter circuit comprising:
a pulse generator including a first output to generate a first pulse signal and a second output to generate a second pulse signal;
a first modulator including a first input to receive a first signal and a second input to receive the first pulse signal, the first modulator modulating the first signal and the first pulse signal to produce a first pulse modulated signal at an output of the first modulator;
a second modulator including a first input to receive a second signal and a second input to receive the second pulse signal, the second modulator modulating the second signal and the second pulse signal to produce a second pulse modulated signal at an output of the second modulator;
a group of power amplifiers, the group of power amplifiers including a first power amplifier including an input to receive the first pulse modulated signal and an output to produce a first amplified pulse modulated signal and including a second power amplifier including an input to receive the second pulse modulated signal and an output to produce a second amplified pulse modulated signal;
a reactive combiner including a plurality of branches, each branch of the plurality of branches coupled to receive an amplified pulse modulated signal produced by a respective power amplifier of the group of power amplifiers, the plurality of branches including a first branch to receive the first amplified pulse modulated signal and a second branch to receive the second amplified pulse modulated signal, the reactive combiner combining the amplified pulse modulated signals received at its branches to produce an output signal at an output of the reactive combiner, wherein the branches of the plurality of branches are each configured to have an impedance such that the output signal is at a first power level when only one power amplifier of the group of power amplifiers is on and is at a second power level when only two power amplifiers of the group of power amplifiers is on, wherein the second power level is in a range of 1.6-2.4 times the first power level.

2. The transmitter circuit of claim 1 wherein the branches of the plurality of branches are each configured to have an impedance such that the second power level is in a range of 1.9-2.1 times the first power level.

3. The transmitter circuit of claim 1 wherein the plurality of branches are coupled together at a summing node of the reactive combiner, wherein each branch of the plurality of branches is configured to have a characteristic impedance $Z_0$, length $l$, and phase constant $\beta$ defined by:

$$Z_{high} = \frac{V(l)}{I(l)} = \frac{1+|\Gamma|e^{-2j\beta l}}{1-|\Gamma|e^{-2j\beta l}}Z_0$$

-continued $$\Gamma = \frac{Z_{off} - Z_0}{Z_{off} + Z_0}$$

wherein $Z_{HIGH}$ is an impedance at the summing node looking back into the each branch when its respective power amplifier is off while only one other power amplifier of the group of power amplifiers is on, $Z_{OFF}$ is the impedance of the input of the each branch looking back into its respective power amplifier when its respective power amplifier is off while only one other power amplifier of the group of power amplifiers is on, wherein $Z_{HIGH}$ is at least above 100 ohms.

4. The transmitter circuit of claim 1 wherein $Z_{HIGH}$ is at least above 400 ohms for a transmitter power of 7 watts or less of a transmitter implementing the transmitter circuit.

5. The transmitter circuit of claim 1 wherein the reactive combiner is characterized as a transmission line reactive combiner.

6. The transmitter circuit of claim 1 wherein the reactive combiner is characterized as a lumped element reactive combiner.

7. The transmitter circuit of claim 1 wherein the first signal and the second signal are each characterized as a constant envelope RF signal.

8. The transmitter circuit of claim 1 further comprising:
a band pass filter coupled to receive the output signal and to provide an output filtered signal at an output of the band pass filter.

9. The transmitter circuit of claim 1 wherein a duty cycle of the first pulse signal and the second pulse signal is adjusted to control a power level of the output signal.

10. A method for operating a transmitter, the method comprising:
modulating a first signal with a first pulse signal to produce a first pulse modulated signal;
modulating a second signal with a second pulse signal to produce a second pulse modulated signal;
amplifying the first pulse modulated signal by a first power amplifier of a group of power amplifiers to produce a first amplified pulse modulated signal;
amplifying the second pulse modulated signal by a second power amplifier of the group of power amplifiers to produce a second amplified pulse modulated signal;
providing the first pulse modulated signal to a first branch of a plurality of branches of a reactive combiner;
providing the second pulse modulated signal to a second branch of the plurality of branches of the reactive combiner;
producing an output signal by combining with the reactive combiner, amplified pulse modulated signals provided to each branch of the plurality of branches and produced by a respective power amplifier of the group, the combining including combining the first pulse modulated signal and the second pulse modulated signal, wherein a power level of the output signal is at a first power level when only one power amplifier of the group is on and is at a second power level when only two power amplifiers of the group are on, wherein the second power level is in a range of 1.6-2.4 times the first power level.

11. The method of claim 10 wherein the second power level is in a range of 1.9-2.1 times the first power level.

12. The method of claim 10 wherein the plurality of branches are coupled together at a summing node of the reactive combiner, wherein each branch of the plurality of branches is configured to have a characteristic impedance $Z_0$, length l, and phase constant $\beta$ defined by:

$$Z_{high} = \frac{V(l)}{I(l)} = \frac{1+|\Gamma|e^{-2j\beta l}}{1-|\Gamma|e^{-2j\beta l}}Z_0$$

$$\Gamma = \frac{Z_{off} - Z_0}{Z_{off} + Z_0}$$

wherein $Z_{HIGH}$ is an impedance at the summing node looking back into the each branch when its respective power amplifier is off while only one other power amplifier of the group of power amplifiers is on, $Z_{OFF}$ is the impedance of the input of the each branch looking back into its respective power amplifier when its respective power amplifier is off while only one other power amplifier of the group of power amplifiers is on, wherein $Z_{HIGH}$ is at least above 100 ohms.

13. The method of claim 10 wherein the reactive combiner is characterized as a transmission line reactive combiner.

14. The method of claim 10 wherein the reactive combiner is characterized as a lumped element reactive combiner.

15. The method of claim 10 wherein the first signal and the second signal are each characterized as a constant envelope RF signal.

16. The method of claim 10 wherein the producing the output signal by the reactive combiner includes inhibiting from the output signal odd order harmonics of a frequency of the first pulse signal by the reactive combiner.

17. The method of claim 10 wherein the first pulse signal and the second pulse signal each have a same frequency but are offset by a phase difference with each other.

18. The method of claim 10 further comprising splitting a third signal into the first signal and the second signal by a splitter.

19. A method for operating a transmitter, the method comprising:

modulating a first signal with a first pulse signal to produce a first pulse modulated signal, the first signal being a constant envelope RF signal;

modulating a second signal with a second pulse signal to produce a second pulse modulated signal, the second signal being a constant envelop RF signal, the second pulse signal being offset by a phase difference from the first pulse signal;

amplifying the first pulse modulated signal by a first power amplifier of a group of power amplifiers to produce a first amplified pulse modulated signal;

amplifying the second pulse modulated signal by a second power amplifier of the group of power amplifiers to produce a second amplified pulse modulated signal;

providing the first amplified pulse modulated signal to a first branch of a plurality of branches of a reactive combiner;

providing the second amplified pulse modulated signal to a second branch of the plurality of branches of the reactive combiner;

producing an output signal by combining with the reactive combiner, amplified pulse modulated signals provided to each branch of the plurality of branches and produced by a respective power amplifier of the group of power amplifiers, the combining including combining the first pulse modulated signal and the second pulse modulated signal, wherein a power level of the output signal is at a first power level when only one power amplifier of the group is on and is at a second power level when only two power amplifiers of the group are on, wherein the producing the output signal by the reactive combiner includes inhibiting from the output signal odd order harmonics of a frequency of the first pulse signal by the reactive combiner.

20. The method of claim 19 wherein the reactive combiner is a two branch reactive combiner, the group of power amplifiers consists of the first power amplifier and the second power amplifier, and the phase difference is 180 degrees.

* * * * *